(12) United States Patent
Li et al.

(10) Patent No.: US 11,616,099 B2
(45) Date of Patent: Mar. 28, 2023

(54) DISPLAY SUBSTRATE WITH TWO-SIDE LIGHT EMITTING COMPONENTS, PREPARATION METHOD THEREOF, AND DISPLAY APPARATUS

(71) Applicant: BOE TECHNOLOGY GROUP CO., LTD., Beijing (CN)

(72) Inventors: Xiaohu Li, Beijing (CN); Zhiqiang Jiao, Beijing (CN); Tun Liu, Beijing (CN); Huajie Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 593 days.

(21) Appl. No.: 16/474,242

(22) PCT Filed: Feb. 20, 2019

(86) PCT No.: PCT/CN2019/075581
§ 371 (c)(1),
(2) Date: Jun. 27, 2019

(87) PCT Pub. No.: WO2020/073573
PCT Pub. Date: Apr. 16, 2020

(65) Prior Publication Data
US 2021/0408154 A1    Dec. 30, 2021

(30) Foreign Application Priority Data
Oct. 11, 2018 (CN) .......................... 201811183629.9

(51) Int. Cl.
*H01L 27/32* (2006.01)
*H01L 51/50* (2006.01)
(Continued)

(52) U.S. Cl.
CPC ...... *H01L 27/3218* (2013.01); *H01L 51/5072* (2013.01); *H01L 51/5092* (2013.01);
(Continued)

(58) Field of Classification Search
CPC ............ H01L 27/3218; H01L 51/5072; H01L 51/5092; H01L 51/5237; H01L 51/5284; H01L 51/56
(Continued)

(56) References Cited

U.S. PATENT DOCUMENTS 8,575,603 B2   11/2013   Chu et al.
9,496,322 B1   11/2016   Zou et al.
(Continued)

FOREIGN PATENT DOCUMENTS

CN    102593150 A    7/2012
CN    104391407 A    3/2015
(Continued)

OTHER PUBLICATIONS

Office Action dated Sep. 2, 2020, issued in counterpart CN Application No. 201811183629.9, with English translation (15 pages).
(Continued)

*Primary Examiner* — Quoc D Hoang
(74) *Attorney, Agent, or Firm* — WHDA, LLP

(57) ABSTRACT

The present disclosure relates to a display substrate. The display substrate may include a base substrate; and a plurality of pixels in a display area on the base substrate. At least one of the plurality of pixels includes a first sub-pixel and a third sub-pixel. The first sub-pixel may include an OLED component that emits light of a first color, the third sub-pixel may include a LED component that emits light of a third color, and the first color and the third color are different colors. All sub-pixels including OLED components may be disposed on a same side of the base substrate, and all sub-pixels including LED components may be disposed on another side of the base substrate opposite the side on which the OLED components are disposed.

18 Claims, 15 Drawing Sheets

(51) Int. Cl.
*H01L 51/52* (2006.01)
*H01L 51/56* (2006.01)

(52) U.S. Cl.
CPC ...... *H01L 51/5237* (2013.01); *H01L 51/5284* (2013.01); *H01L 51/56* (2013.01)

(58) Field of Classification Search
USPC .......................................................... 257/40
See application file for complete search history.

(56) References Cited

U.S. PATENT DOCUMENTS

| | | | |
|---|---|---|---|
| 10,140,904 B2 | 11/2018 | Xu et al. | |
| 10,147,343 B2 * | 12/2018 | Xu | H01L 27/322 |
| 2015/0092137 A1 * | 4/2015 | Kim | G09G 3/3426 |
| | | | 349/69 |
| 2015/0311263 A1 | 10/2015 | Shih et al. | |
| 2017/0062531 A1 * | 3/2017 | Hack | B81B 3/0083 |
| 2017/0213873 A1 * | 7/2017 | Bok | G06F 3/0443 |
| 2017/0294425 A1 * | 10/2017 | Kim | H01L 51/5253 |
| 2018/0012943 A1 | 1/2018 | Ikeda et al. | |
| 2019/0081122 A1 * | 3/2019 | Kim | H01L 27/3248 |

FOREIGN PATENT DOCUMENTS

| | | |
|---|---|---|
| CN | 104538428 A | 4/2015 |
| CN | 105140265 A | 12/2015 |
| CN | 106549034 A | 3/2017 |
| CN | 106707619 A | 5/2017 |
| CN | 107302011 A | 10/2017 |
| JP | 4701675 B2 | 6/2011 |
| WO | 2015081289 A1 | 6/2015 |

OTHER PUBLICATIONS

International Search Report dated May 15, 2019, issued in counterpart application No. PCT/CN2019/075581. (9 pages).
Office Action dated Jul. 19, 2022, issued in counterpart EP Application No. 19765150.8, with Extended European Search Report dated Jun. 29, 2022. (10 pages).

* cited by examiner

DISPLAY SUBSTRATE WITH TWO-SIDE LIGHT EMITTING COMPONENTS, PREPARATION METHOD THEREOF, AND DISPLAY APPARATUS

CROSS-REFERENCE TO RELATED APPLICATIONS

This application claims benefit of the filing date of Chinese Patent Application No. 201811183629.9 filed on Oct. 11, 2018, the disclosure of which is hereby incorporated in its entirety by reference.

TECHNICAL FIELD

The present disclosure relates to the field of display technologies, and in particular, to a display substrate, a preparation method thereof, and a display apparatus.

BACKGROUND

An organic light emitting diode (OLED) display apparatus has been widely used due to its advantages of simple structure, high response, high contrast, high flexibility, and wide viewing angle.

BRIEF SUMMARY

An embodiment of the present disclosure provides a display substrate. The display substrate may include a base substrate and a plurality of pixels in a display area on the base substrate. At least one of the plurality of pixels includes a first sub-pixel and a third sub-pixel. The first sub-pixel includes an OLED component that emits light of a first color, the third sub-pixel includes a LED component that emits light of a third color, and the first color and the third color are different colors. All sub-pixels including OLED components are disposed on a same side of the base substrate, and all sub-pixels including LED components are disposed on another side of the base substrate opposite the side on which the OLED components are disposed.

Optionally, orthographic projection of the OLED component on the base substrate does not overlap orthographic projection of the LED component on the base substrate, and the OLED component and the LED component emit light at a same direction.

Optionally, light of the third color is blue light.

Optionally, the at least one of the plurality of pixels further comprises a second sub-pixel, the second sub-pixel comprises an OLED component that emits light of a second color, the light of the first color, the light of the second color, and the light of the third color are light of three primary colors.

Optionally, the light of the first color is red light, the light of the second color is green light, and the light of the third color is blue light.

Optionally, the base substrate includes a first sub-base substrate, a second sub-base substrate, and a bonding layer between the first sub-base substrate and the second sub-base substrate, the first sub-pixel is on the first sub-base substrate, and the third sub-pixel is on the second sub-base substrate.

Optionally, the OLED component that emits the light of the first color in the first sub-pixel and the OLED component that emits the light of the second color in the second sub-pixel are top-emitting OLED components.

Optionally, the third sub-pixel comprises a first area and a second area, the LED component is in the first area, and a third driving circuit that drives the LED component to emit light is in the second area, and the second area overlaps the area where the first sub-pixel and/or the second sub-pixel are located.

Optionally, the first sub-pixel further comprises a first driving circuit, and the second sub-pixel further comprises a second driving circuit. In the first sub-pixel, the first driving circuit is electrically coupled to an anode of the OLED component that emits the light of the first color; in the second sub-pixel, the second driving circuit is electrically coupled to an anode of the OLED component that emits the light of the second color.

Optionally, the display substrate further comprises a cathode, an electron injection layer, and an electron transport layer, wherein the cathode, the electron injection layer, and the electro transport layer are respectively a layer in the entire display area.

Optionally, a transparent insulating layer is disposed in an area corresponding to the third sub-pixel between the cathode and the base substrate, thereby flattening the cathode.

Optionally, in an area corresponding to the third sub-pixel, the cathode is in direct contact with the base substrate.

Optionally, the display substrate further comprises an encapsulation layer on a light exit side of the OLED component and in the display area.

Optionally, the display substrate further comprises a black matrix on a side of the encapsulation layer opposite from the base substrate; wherein the black matrix is in a non-light emitting area of the display area.

Optionally, the display substrate further comprises an optical adjustment layer on a side of the encapsulation layer facing the OLED component; the optical adjustment layer being in the display area.

Optionally, the LED component is a micro LED component or mini LED component.

One example of the present disclosure is a display apparatus, comprising the display substrate according to one embodiment of the present disclosure.

One example of the present disclosure is a method for preparing a display substrate. The method may include forming a first sub-pixel on a first surface of the base substrate and forming a third sub-pixel on a second surface of the base substrate. The first sub-pixel comprises an OLED component that emits light of a first color; the second surface opposite the first surface, the third sub-pixel comprises an LED component emitting light of a third color, and the first color and the third color are different colors.

Optionally, the base substrate comprises a first sub-base substrate, a second sub-base substrate, and a bonding layer between the first sub-base substrate and the second sub-base substrate.

Optionally, forming the first sub-pixel and the second sub-pixel on the first surface of the base substrate comprises forming the first sub-pixel and the second sub-pixel on the first sub-base substrate, and forming the third sub-pixel on the second surface of the base substrate comprises forming the third sub-pixel on the second sub-base substrate.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
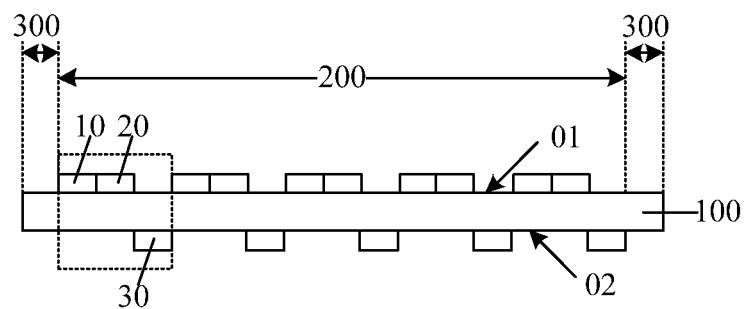
FIG. 1 is a schematic structural diagram of a display substrate according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-13. When referring to the figures, like structures and elements shown throughout are indicated with like reference numerals.

Unless otherwise defined, any technical or scientific term used herein shall have the common meaning understood by a person of ordinary skill in the art. Words such as "first" and "second" used in the specification and claims are merely used to differentiate different components rather than to represent any order, number or importance of the components. Similarly, such word as "including" or "comprising" are merely used to represent that the element or unit presented prior to the word contains elements, units and the like enumerated subsequent to the word, instead of excluding other elements or units.

One example of the present disclosure provides a display substrate, as shown in FIG. 1, including a base substrate 100, and a plurality of pixels disposed on the base substrate 100 and located in the display area 200 (shown by a broken line in FIG. 1). Each pixel includes a first sub-pixel 10, a second sub-pixel 20, and a third sub-pixel 30. The first sub-pixel 10 includes an OLED component that emits light of a first color, and the third sub-pixel 30 includes a light emitting diode (LED) component that emits light of a third color. The light of the first color and the light of the third color are light of different colors. All the sub-pixels including the OLED components are disposed on a same side of the base substrate 100. All the sub-pixels including the LED components are disposed on the other side of the base substrate 100 opposite the side on which the OLED components are disposed.

In one embodiment, orthographic projection of the OLED component on the base substrate does not overlap orthographic projection of the LED component on the base substrate, and the OLED component and the LED component emit light at a same direction.

It should be noted that the base substrate 100 can be divided into a display area 200 and a peripheral wiring area 300, and the peripheral wiring area 300 is located at the periphery of the display area 200.

All sub-pixels including the OLED components are disposed on the same side of the base substrate 100, and all sub-pixels including the LED components are disposed on the other side of the base substrate 100. That is, all the sub-pixels including the OLED components are disposed on the first surface 01 of the base substrate 100, and all the sub-pixels including the LED components are disposed on the second surface 02 of the base substrate 100. The first surface 01 and the second surface 02 are opposite from each other.

In some embodiments, the first sub-pixel 10 emits light of a first color, and the third sub-pixel 30 emits light of a third color. In the case where the light of the first color and the light of the third color are light of different color, the second sub-pixel 20 should be capable of emitting a light of a second color different from the light of the first color and the light of the third color to be applied to the display substrate. As such, the display panel can perform normal color display when the panel is displayed. Based on this, although the second sub-pixel 20 is not limited above, the second sub-pixel 20 necessarily includes a light-emitting component that emits light of a second color, wherein the type of the light-emitting component is not limited herein.

For a conventional OLED display panel in which each sub-pixel adopts an OLED component as a light-emitting component, the color of light from the light-emitting layer of each sub-pixel is determined by the material of the light-emitting layer in the OLED component in the sub-pixel. As such, the OLED display panel is subjected to the development limitation of the material of the light-emitting layer, thereby resulting in different life spans for OLED components emitting different colors of lights. Thus, if only one OLED component that emits a certain color of light has a short life span, and the life spans of the remaining OLED components are long, the overall life span of the OLED display panel is short.

In the embodiments of the present disclosure, an OLED component that emits light of a certain color with excellent light-emitting property and a long life span is selected to be disposed in the first sub-pixel 10 as an OLED component that emits light of a first color. An LED component that emits light of another color with excellent light-emitting property and a long life span is selected to be disposed in the third sub-pixel 30 as an LED component that emits a third color light. As such, the difference in life spans of the light-emitting components in the first sub-pixel 10 and the third sub-pixel 30 can be reduced. On the basis of this, for the second sub-pixel 20, the second sub-pixel 20 is not limited to the type of the light-emitting component disposed therein. Similarly, by selecting the light-emitting component having excellent light-emitting performance and excellent longevity for the second sub-pixel 20, the service life of the display panel including the display substrate can be improved as a whole.

In the display substrate provided by the embodiments of the present disclosure, on one hand, by using a combination of the OLED components and the LED components in the display substrate, based on characteristics of the LED components emitting different color lights and characteristics of the OLED components emitting different color lights, OLED components with excellent light-emitting performance and long life span and LED components with excellent light-emitting performance and long life span can be selected to be respectively disposed in different sub-pixels. Therefore, when the display substrate is applied to the display apparatus, the service life of the display apparatus as a whole is increased significantly. On the other hand, by disposing all the sub-pixels including the OLED components on the same side of the base substrate 100, these sub-pixels can be formed simultaneously. Similarly, by disposing all the sub-pixels including the LED components on the same opposite side of the base substrate 100, these sub-pixels can also be formed simultaneously. As such, the manufacturing difficulty is reduced. Furthermore, the third sub-pixels 30 including the LED components and the first sub-pixels 10 including the OLED components are respectively disposed on opposite sides of the base substrate 100. As such, the thickness of the display apparatus is relatively thin and the structure thereof is more compact.

Optionally, the second sub-pixel 20 includes an OLED component that emits light of a second color. The light of the first color, the light of the second color, and the light of the third color are light of three primary colors.

Figure 2A:
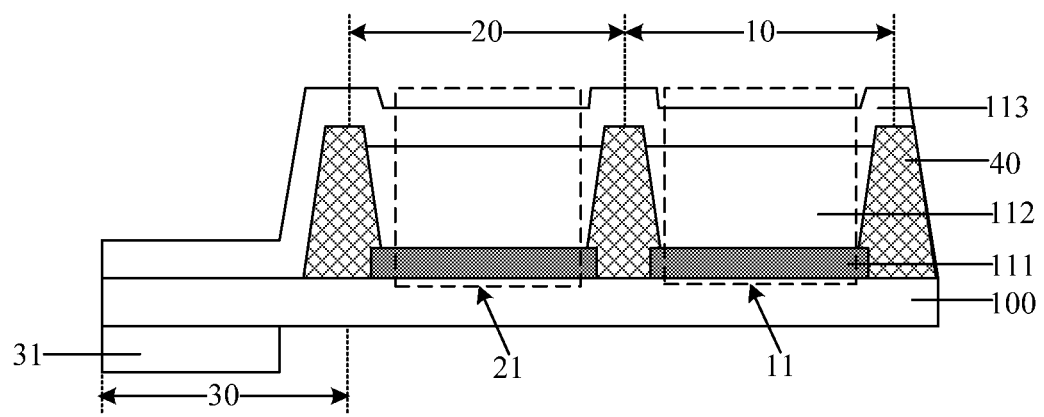
FIG. 2a is a schematic structural diagram of a display substrate according to one embodiment of the present disclosure.

As shown in FIG. 2a, in order to clearly describe the structures of the first sub-pixel 10 and the second sub-pixel 20, the first OLED component 11 represents the OLED component in the first sub-pixel 10 that emits the light of the first color, and the second OLED component 21 represents an OLED component that emits the light of the second color in the second sub-pixel 20. Wherein, in the case that the first sub-pixel 10 and the second sub-pixel 20 are adjacent, the first OLED component 11 and the second OLED component 21 are separated by a pixel defining layer 40.

The manufacture of the conventional OLED display panel has matured and the performance is also good. However, the life span of the conventional OLED display panel is short. Some embodiments of the present disclosure replace the OLED component having the shortest life span with a LED component of the same color having a relatively long life span, thereby improving the service life of the display panel as a whole.

Based on this, in some embodiments of the present disclosure, for the first sub-pixel 10, the second sub-pixel 20, and the third sub-pixel 30, the LED component 31 is disposed in the third sub-pixel 30 only to replace the OLED component having the same color having the shortest life span. The OLED components are still disposed in the other two sub-pixels. In this way, the impact thereof can be minimized compared to the conventional OLED display panel, both in terms of manufacturing of the display substrate and performance of the display panel including the display substrate.

In some embodiments, the light of the first color is red light, the light of the second color is green light, and the light of the third color is blue light. That is, as shown in FIG. 2, in the case where the first sub-pixel 10 includes the first OLED component 11, the second sub-pixel 20 includes the second OLED component 21, and the third sub-pixel 30 includes the LED component 31, the first OLED component 11 emits red light, the second OLED component 21 emits green light, and the LED component 31 emits blue light.

Figure 3:
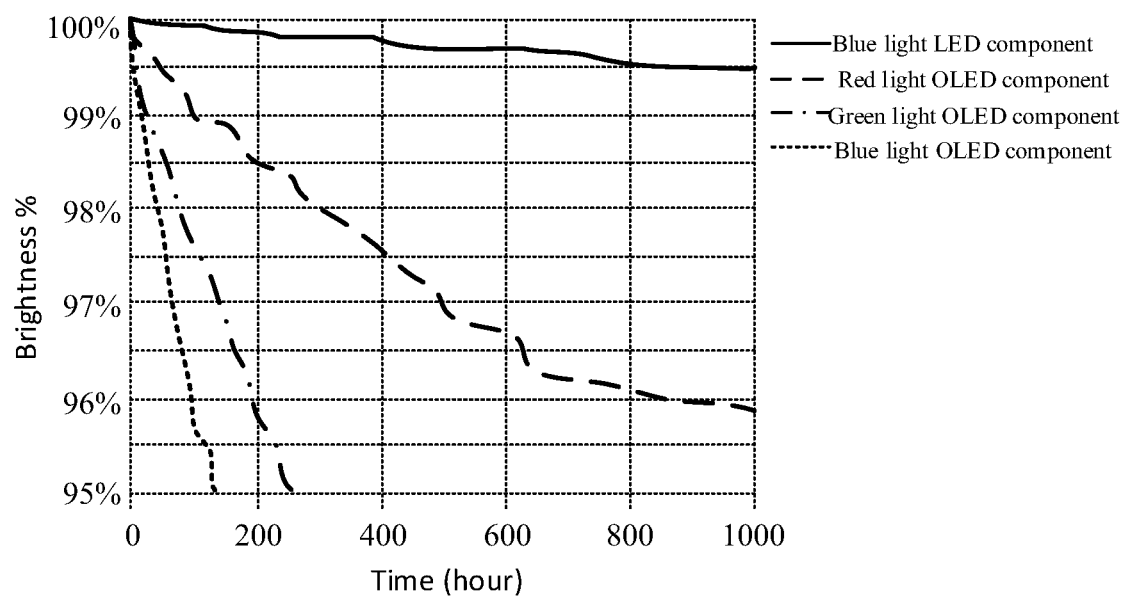
FIG. 3 is a schematic diagram showing the brightness of a red-emitting OLED component, a green-emitting OLED component, a blue-emitting OLED component, and a blue-emitting LED component as a function of time of use.

FIG. 3 shows curves of brightness verse time of use for a red-emitting OLED component, a green-emitting OLED component, a blue-emitting OLED component, and a blue-emitting LED component 31. As can be seen from FIG. 3, the blue-emitting OLED component has the fastest rate of brightness reduction compared to the green-emitting OLED component and the red-emitting OLED component. The corresponding blue-emitting OLED component has the shortest life span.

Moreover, it can also be seen from FIG. 3 that the blue-emitting LED component 31 has a very slow decrease in brightness with time, and the blue-emitting LED component 31 has a lower brightness reduction rate than the red-emitting OLED component.

Therefore, in the embodiments of the present disclosure, by replacing the blue light-emitting OLED component with the blue light-emitting LED component 31 with excellent performance and long life span, the characteristics of the blue-emitting LED component 31 can be better utilized to improve the life span of the display panel to which the display substrate according to one embodiment of the present disclosure is applied.

Figure 4:
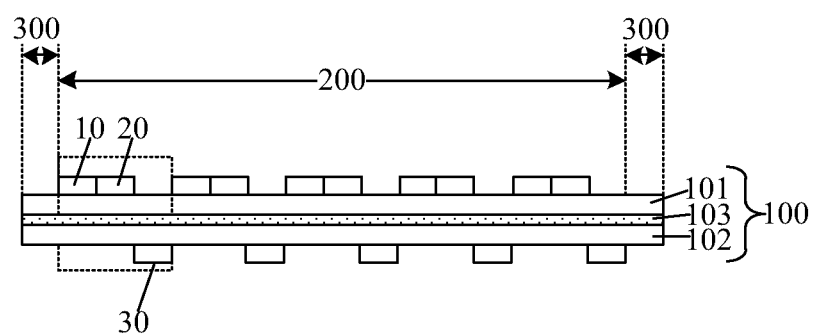
FIG. 4 is a schematic structural diagram of a display substrate according to one embodiment of the present disclosure.
Figure 5:
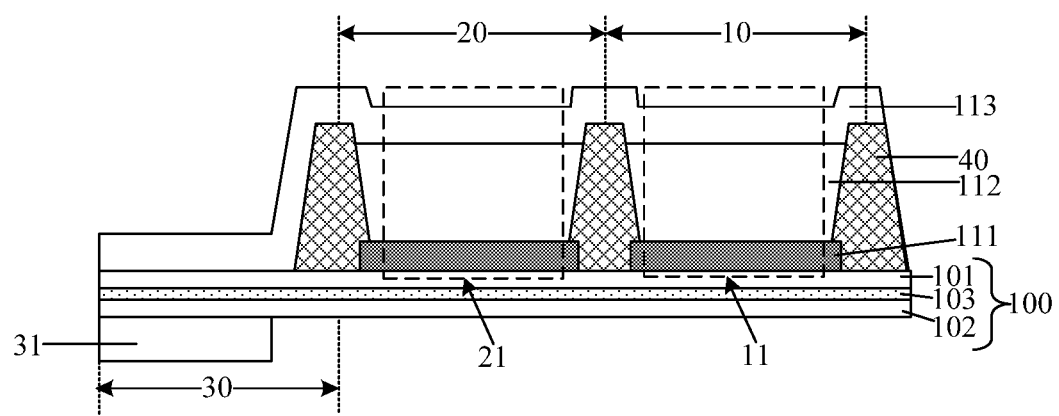
FIG. 5 is a schematic structural diagram of a display substrate according to one embodiment of the present disclosure.

Optionally, as shown in FIG. 4 and FIG. 5, the base substrate 100 includes a first sub-base substrate 101, a second sub-base substrate 102, and a bonding layer 103 therebetween. The first sub-pixel 10 is disposed on the first sub-base substrate 101, and the third sub-pixel 30 is disposed on the second sub-base substrate 102.

In some embodiments, the second sub-pixel 20 includes the second OLED component 21, the first sub-pixel 10 and the second sub-pixel 20 are both disposed on the first sub-base substrate 101.

Based on this, in preparing the display substrate, the first sub-pixel 10 and the second sub-pixel 20 can be formed on the first sub-base substrate 101, and the third sub-pixel 30 can be formed on the second sub-base substrate 102. Then, the first sub-base substrate 101 and the second sub-base substrate 102 can then be aligned and adhered to each other by a bonding layer. In this way, the manufacturing difficulty of the display substrate can be reduced, and the efficiency is high.

Optionally, the first OLED component 11 in the first sub-pixel 10 and the second OLED component 21 in the second sub-pixel 20 are all top-emitting OLED components.

Optionally, as shown in FIG. 2a, each of the first OLED component 11 and the second OLED component 21 includes an anode 111, a light-emitting function layer 112, and a cathode 113, and the light-emitting function layer 112 is in contact with the anode 111 and the cathode 113 on both sides thereof. In some embodiments, the anode 111 is close to the base substrate 100 and the cathode 113 is disposed on the side of the anode 111 opposite from the base substrate 100.

Furthermore, the anode 111 is opaque, and the structure thereof may have, for example, a structure of indium tin oxide (ITO)/silver (Ag)/ITO three layers. Cathode 113 can be transparent or translucent. The light-emitting functional layer 112 includes, but is not limited to, a hole injection layer, a hole transport layer, an electron blocking layer, a light-emitting layer, a hole blocking layer, an electron transport layer, and an electron injection layer.

Figure 2B:
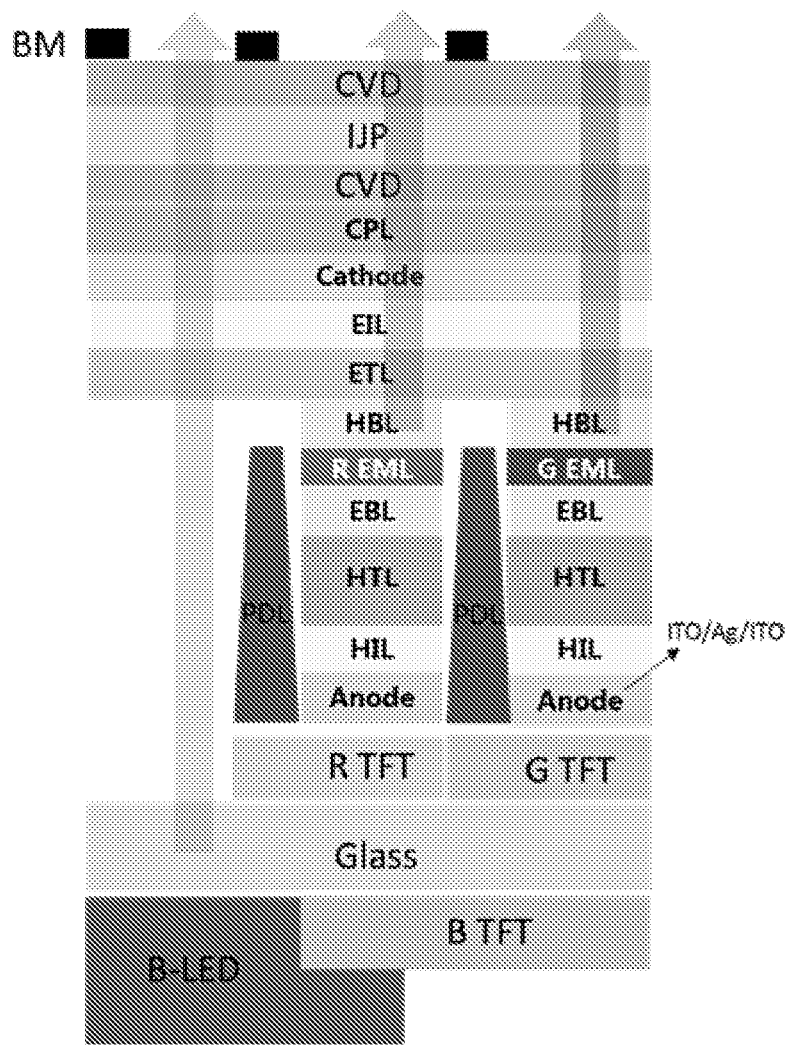
FIG. 2b is a schematic structural diagram of a display substrate according to one embodiment of the present disclosure.

In some embodiments, as shown in FIG. 2b, the display substrate further includes a cathode, an electron injection layer (EIL), and an electron transport layer (ETL), a hole block layer (HBL), an emission layer (EML), an electron block layer (EBL), a hole transport layer (HTL), and a hole injection layer (HIL). The cathode, the electron injection layer (EIL), and the electro transport layer (ETL) are respectively a layer in the entire display area.

In some embodiments, the light emitting surface of the LED component 31 faces the base substrate 100, that is, the light emitted from the LED component 31 is emitted through the cathode 113.

When the first OLED component 11 and the second OLED component 21 are both top emission type OLED components, the aperture ratio of the display substrate can be improved. Moreover, the anode 111 is opaque, and light emitted from the LED component 31 can be prevented from entering the first sub-pixel 10 and the second sub-pixel 20.

Figure 6:
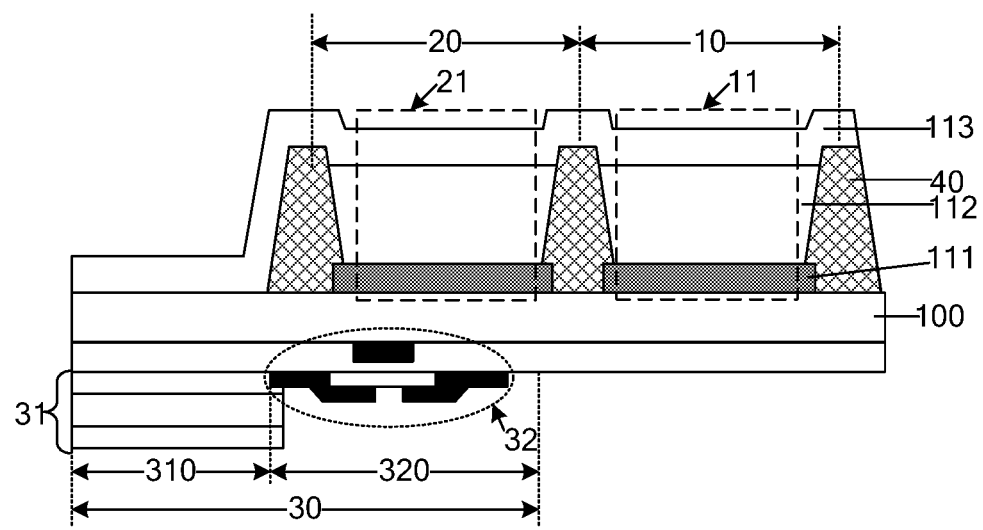
FIG. 6 is a schematic structural diagram of a display substrate according to one embodiment of the present disclosure.

Optionally, as shown in FIG. 6, the third sub-pixel 30 is divided into a first area 310 and a second area 320. The LED component 31 is disposed in the first area 310. A third driving circuit 32 that drives the LED component 31 to emit light is disposed in the second area 320. The second area 320 overlaps with an area where the first sub-pixel 10 and/or the second sub-pixel 20 are located.

The second area 320 overlaps with the area where the first sub-pixel 10 and/or the second sub-pixel 20 are located means that orthographic projection of the second area 320 on the base substrate overlaps the orthographic projection of the first sub-pixel 10 and/or the second sub-pixel 20 on the base substrate. That is, when the first area 310 of the third sub-pixel 30 in the pixel is adjacent to the second sub-pixel 20, the second area 320 overlaps with the area where the second sub-pixel 20 is located or overlaps with the area where the second sub-pixel 20 and the first sub-pixel 10 are located. When the first area 310 of the third sub-pixel 30 in the pixel is adjacent to the first sub-pixel 10, then the second area 320 overlaps with the area where the first sub-pixel 10 is located, or overlaps with the area where the first sub-pixel 10 and the second sub-pixel 20 are located.

In some embodiments, in order to prevent the light emitted by the third sub-pixel 30 from causing interference to the first sub-pixel 10 and/or the second sub-pixel 20, the LED component 31 should be disposed in an area of the third sub-pixel 30 that does not overlap with the first sub-pixel 10 and the second sub-pixel 20. That is, the first area 310 does not overlap with the area where the first sub-pixel 10 and the second sub-pixel 20 are located.

In addition, the third driving circuit 32 in FIG. 6 is illustrated by only one thin film transistor (TFT), but the embodiment of the present disclosure is not limited thereto, and the third driving circuit 32 may be set according to a specific driving manner.

By disposing the third driving circuit 32 that drives the LED component 31 in an area corresponding to the first sub-pixel 10 and/or the second sub-pixel 20, the LED component 31 can be mainly placed in an area where the third sub-pixel 30 and the first sub-pixel 10 and the second sub-pixel 20 do not overlap, thereby facilitating reducing the size occupied by each pixel, and is more advantageous for improving the resolution.

Figure 7A:
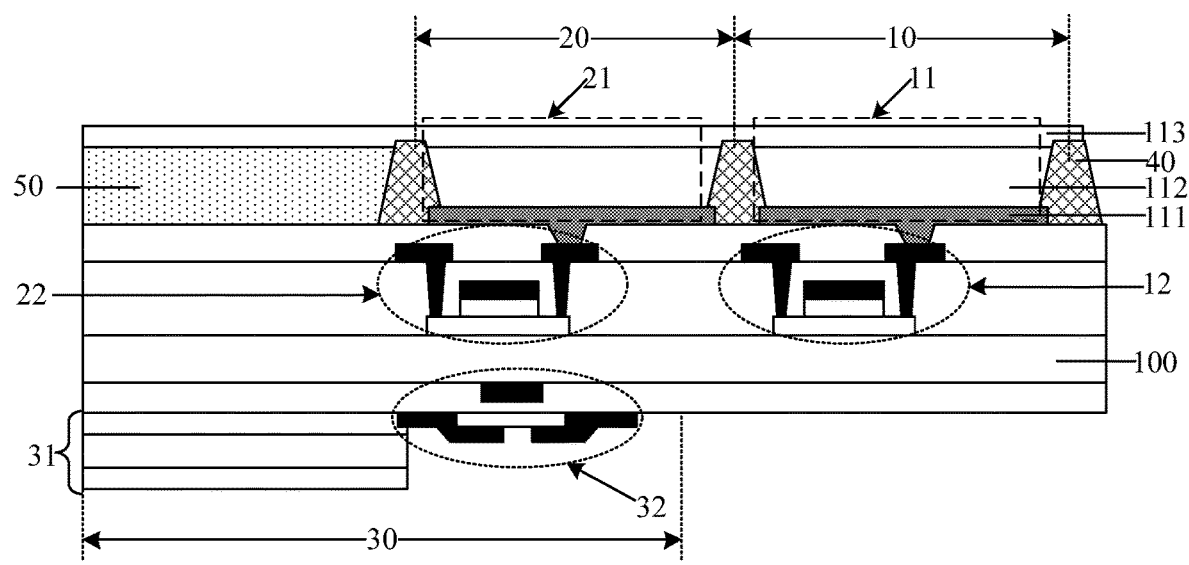
FIG. 7a is a schematic structural diagram of a display substrate according to one embodiment of the present disclosure.

Optionally, as shown in FIG. 7a, the first sub-pixel 10 further includes a first driving circuit 12, and the second sub-pixel 20 further includes a second driving circuit 22. In the first sub-pixel 10, the first driving circuit 12 is electrically coupled to the anode 111 of the first OLED component 11. In the second sub-pixel 20, the second driving circuit 22 is electrically coupled to the anode 111 of the second OLED component 21. The cathode 113 is disposed in the entire display area 200.

Optionally, as shown in FIG. 7a, a transparent insulating layer 50 is disposed in an area corresponding to the third sub-pixel 30 between the cathode 113 and the base substrate 100 to keep the cathode 113 flat. The area corresponding to the third sub-pixel 30 means orthographic projection of the area on the base substrate overlaps or coincides with orthographic projection of the third sub-pixel 30 on the base substrate.

The material of the transparent insulating layer 50 may be an organic material, an inorganic material, or a combination of the two, which is not limited herein.

It should be noted that, in the process of forming the first sub-pixel 10 and the second sub-pixel 20, the film thickness of the area on the same side of the base substrate 100 and corresponding to the third sub-pixel 30 is smaller than the film thicknesses in the first sub-pixel 10 and the second sub-pixel 20, thereby resulting in a large film thickness difference. Therefore, when the transparent insulating layer 50 is provided in the area corresponding to the third sub-pixel 30 on the same side of the base substrate 100 as the first sub-pixel 10 and the second sub-pixel 20, the film thickness of the area can be increased, thereby decreasing the film thickness difference between the area and the first sub-pixel 10 and the second sub-pixel 20.

Optionally, in the case where the third sub-pixel 30 includes the first area 310 and the second area 320, a transparent insulation layer 50 is disposed in the area corresponding to the first region 310 between the cathode 113 and the base substrate 100. By providing the transparent insulating layer 50, the film layer under the cathode 113 can be made flatter.

Figure 7B:
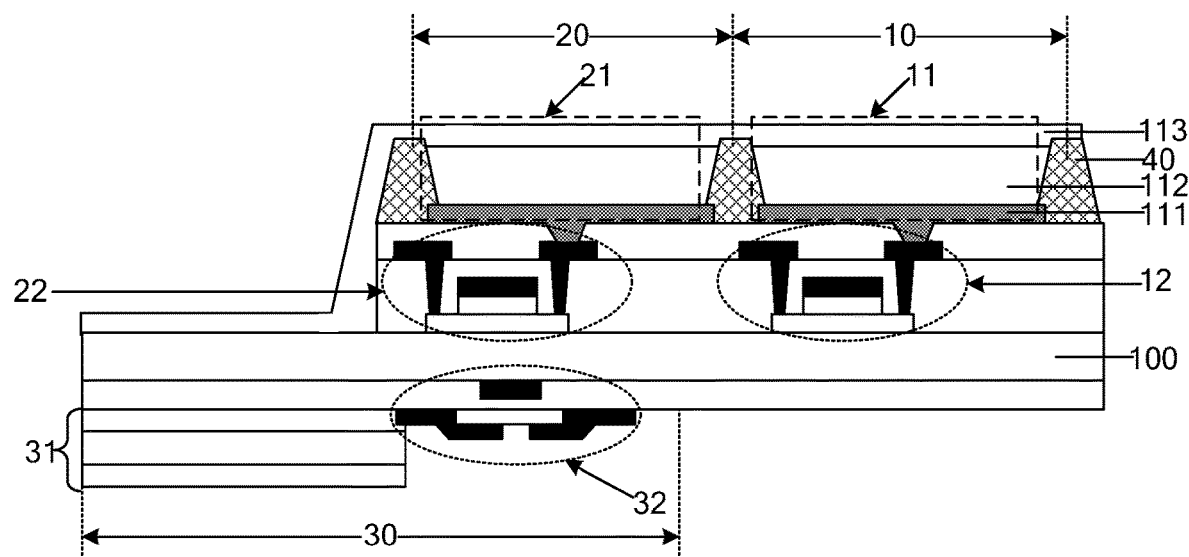
FIG. 7b is a schematic structural diagram of a display substrate according to one embodiment of the present disclosure.

Optionally, as shown in FIG. 7b, the first sub-pixel 10 further includes a first driving circuit 12, and the second sub-pixel 20 further includes a second driving circuit 22. In the first sub-pixel 10, the first driving circuit 12 is electrically coupled to the anode 111 of the first OLED component 11. In the second sub-pixel 20, the second driving circuit 22 is electrically coupled to the anode 111 of the second OLED component 21. The cathode 113 is disposed in the entire display area 200.

Optionally, as shown in FIG. 7b, the cathode 113 is in direct contact with the base substrate 100 in the area corresponding to the third sub-pixel 30.

Optionally, in the case where the third sub-pixel 30 includes the first area 310 and the second area 320, the cathode 113 is in direct contact with the base substrate 100 in the area corresponding to the first area 310.

By directly contacting the cathode 113 with the base substrate 100 in the area corresponding to the third sub-pixel 30, the transmittance of light emitted by the third sub-pixel 30 can be increased.

It should be noted that the first driving circuit 12 in FIG. 7a and FIG. 7b is illustrated by only one TFT, but the embodiments of the present disclosure are not limited thereto. The first driving circuit 12 may be disposed according to a specific driving manner. The second driving circuit 22 in FIG. 7a and FIG. 7b is illustrated by only one TFT, but the embodiments of the present disclosure are not limited thereto. The second driving circuit 22 may be disposed according to a specific driving manner.

Figure 8:
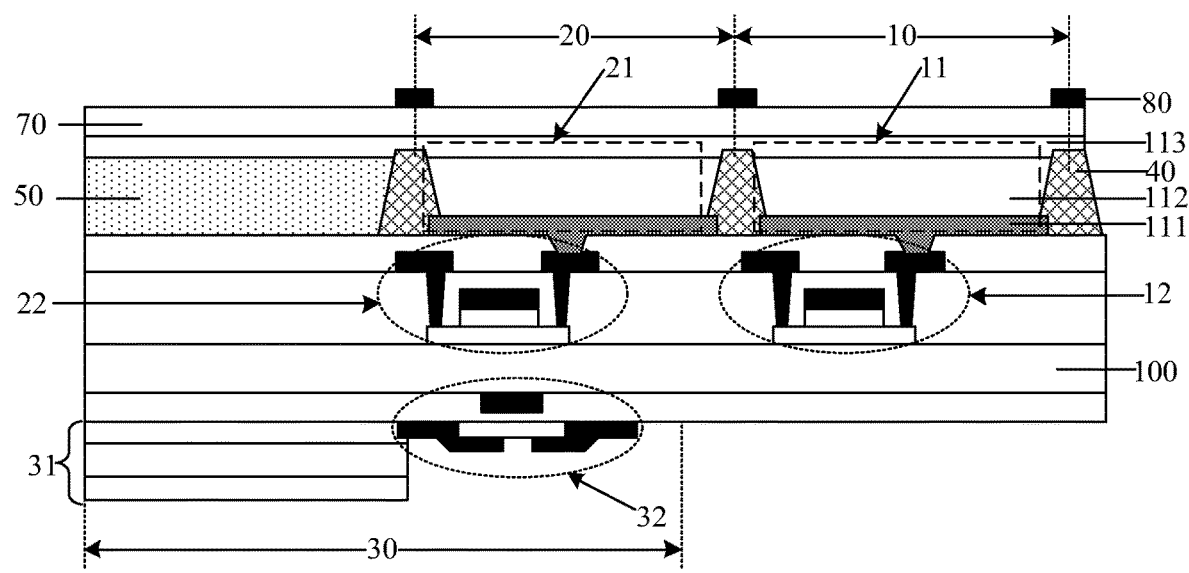
FIG. 8 is a schematic structural diagram of a display substrate according to one embodiment of the present disclosure.

Optionally, as shown in FIG. 8, the display substrate further includes an encapsulation layer 70 disposed on the light exiting side of the first OLED component 11 and the second OLED component 21 and located in the display region 200, and a black matrix 80 disposed on a side of the encapsulation layer 70 opposite from the base substrate 100. The black matrix 80 is disposed in the non-light-emitting area of the display area 200, that is, the black matrix 80 is disposed between adjacent sub-pixels In some embodiments, the encapsulation layer 70 may include at least three layers of structures, which may be a structure in which an organic layer is sandwiched between two inorganic layers.

On one hand, the OLED component in each sub-pixel can be effectively protected by the encapsulation layer 70. On the other hand, by disposing the black matrix 80, the light emitted by the first sub-pixel 10, the second sub-pixel 20, and the third sub-pixel 30 can be better distinguished from one another to avoid color mixing.

Figure 9:
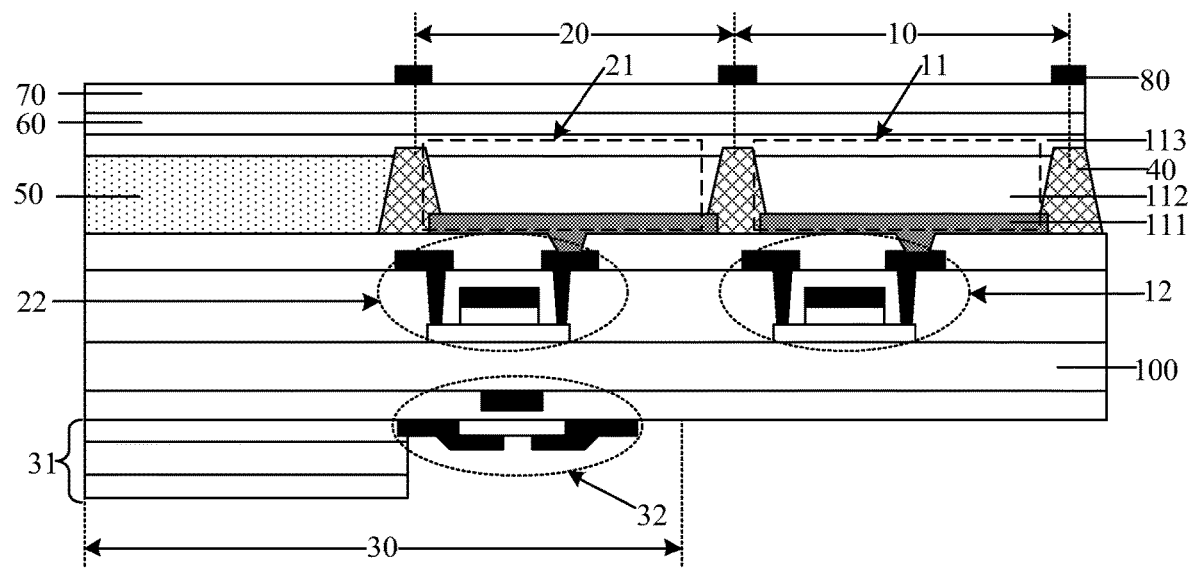
FIG. 9 is a schematic structural diagram of a display substrate according to one embodiment of the present disclosure.

Optionally, as shown in FIG. 9, the display substrate further includes an optical adjustment layer 60 disposed on the side of the encapsulation layer 70 facing the first OLED component 11 and the second OLED component 21. The optical adjustment layer 60 is disposed in the entire display area 200.

In some embodiments, the optical adjustment layer 60 can be made of a material having a high refractive index.

By providing the optical adjustment layer 60, the resolution of the display panel to which the display substrate is applied can be enhanced, thereby improving the display effect.

Optionally, the third LED component 31 is a micro LED component. Micro LED components are smaller in size, which is more conducive to improving display resolution. The micro LED component can be a Mini-LED or a Micro-LED.

Some embodiments of the present disclosure also provide a display panel including the above display substrate according to one embodiment of the present disclosure. The display panel has the same beneficial effects as the display substrate, and details thereof are not described herein again.

Some embodiments of the present disclosure also provide a display apparatus including the above display substrate. The display apparatus has the same beneficial effects as the display substrate, and details thereof are not described herein again.

Figure 10:
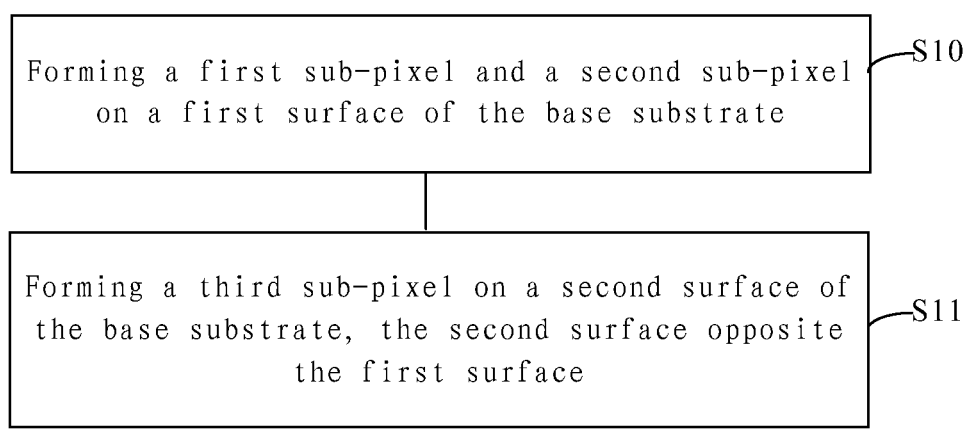
FIG. 10 is a schematic flowchart of a method for preparing a display substrate according to one embodiment of the present disclosure.

Some embodiments of the present disclosure also provide a method for preparing a display substrate. As shown in FIG. 10, the method for preparing a display substrate includes the following:

In step S10, as shown in FIG. 1 and FIG. 2, a first sub-pixel 10 and a second sub-pixel 20 are formed on one side of the base substrate 100. The first sub-pixel 10 includes an OLED component that emits light of a first color (ie, first OLED component 11), and the second sub-pixel 20 comprises an OLED component that emits light of a second color (ie, second OLED component 21).

Optionally, as shown in FIG. 2, each of the first OLED component 11 and the second OLED component 21 includes an anode 111, a light-emitting function layer 112, and a cathode 113. The light-emitting function layer 112 is in contact with the anode 111 and the cathode 113 on both sides thereof. Optionally, the first OLED component 11 and the second OLED component 21 may both be top-emitting OLED components.

In step S11, as shown in FIG. 1 and FIG. 2, a third sub-pixel 30 is formed on the other side of the base substrate 100 opposite the side on which the first sub-pixel 10 and the second sub-pixel 20 are formed. The third sub-pixel 30 includes an LED component 31 that emits light of a third color. In one embodiment, the light of the first color, the light of the second color, and the light of the third color are lights of three primary colors.

In some embodiments, the LED component 31 can be formed on the other side of the base substrate 100 by a transferring and bonding technique.

In the method for fabricating a display substrate provided by some embodiments of the present disclosure, by using a combination of OLED components and LED components in the display substrate, based on characteristics of the LED component emitting different color lights and characteristics of the OLED component emitting different color lights, OLED components with excellent light-emitting performance and long life span and LED components with excellent light-emitting performance and long life span are selected to be respectively formed in different sub-pixels. Therefore, when the display substrate is applied to the display apparatus, the service life of the display apparatus as a whole is significantly improved. Wherein, for the first sub-pixel 10, the second sub-pixel 20, and the third sub-pixel 30, only the OLED component emitting the same color light with the shortest life span is replaced by the LED component 31 in the third sub-pixel 30, and the OLED components are still in other two sub-pixels. In this way, the impact thereof can be minimized compared to the conventional OLED display component, both in terms of manufacturing of the display substrate and performance of the display apparatus including the display substrate.

Optionally, the third sub-pixel 30 including the LED component 31 and the first sub-pixel 10 and the second sub-pixel 20 including the OLED components are respectively formed on opposite sides of the base substrate 100, so that the thickness of the display panel can be relatively thin, and the structure thereof is more compact.

Optionally, the light of the first color is red light, the light of the second color is green light, and the light of the third color is blue light. That is, as shown in FIG. 2, in the case where the first sub-pixel 10 includes the first OLED component 11, the second sub-pixel 20 includes the second OLED component 21, and the third sub-pixel 30 includes the LED component 31, the first OLED component 11 emits red light, the second OLED component 21 emits green light, and the LED component 31 emits blue light.

In the embodiment of the present disclosure, by replacing the blue-emitting OLED component with the blue light-emitting LED component 31 with excellent performance and long life span, the characteristics of the blue-emitting LED component 31 can be better utilized to improve the service life of the display panel to which the display substrate of the present disclosure is applied.

Optionally, referring to FIG. 1, the base substrate 100 includes a first surface 01 and a second surface 02 opposite the first surface. Based on this, when the first sub-pixel 10, the second sub-pixel 20, and the third sub-pixel 30 are formed, the first sub-pixel 10 and the second sub-pixel 20 may be formed on the first surface 01 of the base substrate 100, and then the third sub-pixel 30 is formed on the second surface 02 of the base substrate 100.

For the first surface 01 and the second surface 02, for example, in the case where the base substrate 100 is horizontally placed, the upward facing side is the first surface 01, and the downward facing side is the second surface 02. Alternatively, the upward facing surface is the second surface 02, and the downward facing side is the first surface 01.

In the preparation process of the display substrate, the first sub-pixel 10 and the second sub-pixel 20 are first formed on the first surface 01 of the base substrate 100. Then, after packaging, when the third sub-pixel 30 is formed on the second surface 02 of the base substrate 100, the previously formed first sub-pixel 10 and second sub-pixel 20 are not affected, especially for OLED components formed in the first sub-pixel 10 and the second sub-pixel 20. Moreover, when the first sub-pixel 10 and the second sub-pixel 20 are formed first, and then the third sub-pixel 30 is formed, the LEDs in the third sub-pixel 30 can be prevented from falling off when the first sub-pixel 10 and the second sub-pixel 20 are formed.

Figure 11:
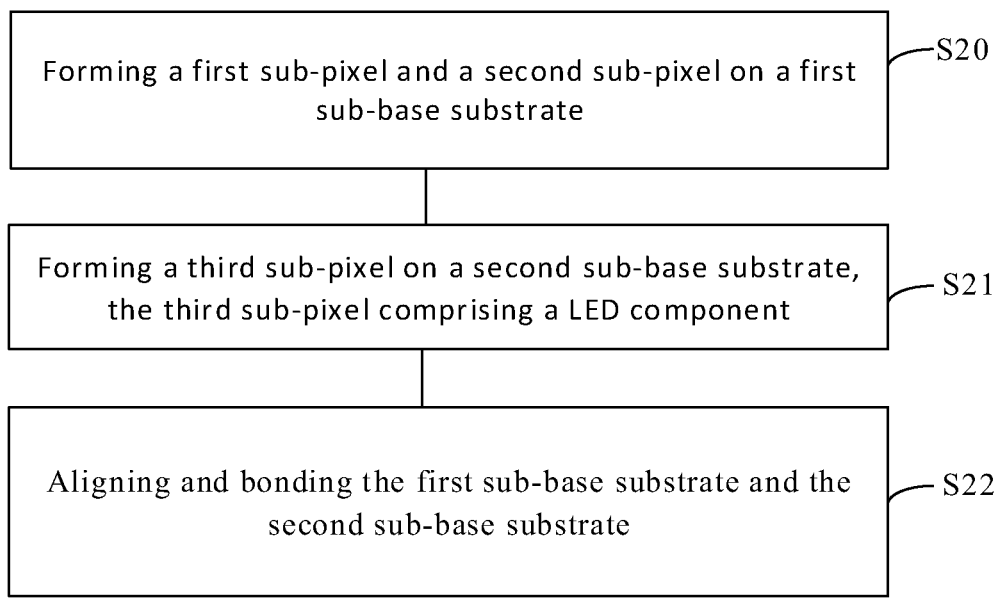
FIG. 11 is a schematic flow chart of a method for preparing a display substrate according to one embodiment of the present disclosure.
Figure 12:
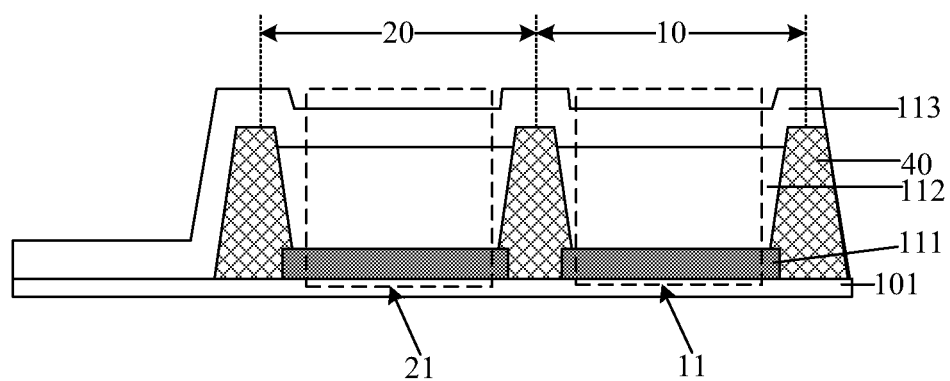
FIG. 12 is a schematic structural diagram of forming a first sub-pixel and a second sub-pixel on a first sub-base substrate according to one embodiment of the present disclosure.

Optionally, the base substrate 100 includes a first sub-base substrate 101, a second sub-base substrate 102, and a bonding layer 103 therebetween. On the basis of the above, the method for preparing the display substrate, as shown in FIG. 11, includes the following:

In step S20, as shown in FIG. 12, the first sub-pixel 10 and the second sub-pixel 20 are formed on the first sub-base substrate 101. The first sub-pixel 10 includes a first OLED component 11 and the second sub-pixel 20 includes a second OLED component 21.

Figure 13:
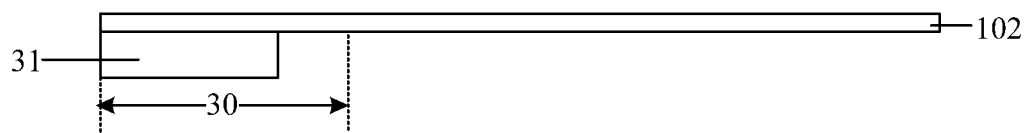
FIG. 13 is a schematic structural diagram of forming a third sub-pixel on a second sub-base substrate according to one embodiment of the present disclosure.

In step S21, as shown in FIG. 13, a third sub-pixel 30 is formed on the second sub-substrate substrate 102. The third sub-pixel 30 includes an LED component 31 that emits light of a third color.

In step S22, referring to FIG. 5, the first sub-base substrate 101 and the second sub-base substrate 102 are aligned, and one side of the first sub-base substrate 101 on which the first sub-pixel 10 and the second sub-pixel 20 are not formed is adhered to the side of the second sub-base substrate 102 where the third sub-pixel 30 is not formed by the bonding layer 103.

Optionally, in the case that both the first OLED component 11 and the second OLED component 21 are top-emitting OLED components, referring to FIG. 6, the third sub-pixel 30 further includes a third driving circuit 32 that drives the LED component 31 to emit light. The third sub-pixel 30 includes a first area 310 and a second area 320. The LED component 31 is formed in the first area 310, and the third driving circuit 32 is formed in the second area 320. The second area 320 overlaps an area where the first sub-pixel 10 and/or the second sub-pixel 20 are located.

In some embodiments, in order to prevent the light emitted by the third sub-pixel 30 from causing interference to the first sub-pixel 10 and/or the second sub-pixel 20, the LED component 31 should be disposed in an area where the third sub-pixel 30 does not overlap the first sub-pixel 10 and the second sub-pixel. The third sub-pixel 30 does not overlap the first sub-pixel 10 and the second sub-pixel means that orthographic projection of the third sub-pixel 30 on the base substrate does not overlap orthographic projection of the first sub-pixel 10 and the second sub-pixel. That is, the first area 310 does not overlap with the area where the first sub-pixel 10 and the second sub-pixel 20 are located.

In some embodiments, the third driving circuit 32 that drives the LED component 31 is formed in an area corresponding to the first sub-pixel 10 and/or the second sub-pixel 20. The LED component 31 is mainly formed in an area where the third sub-pixel 30 does not overlap with the first sub-pixel 10 and the second sub-pixel 20. As such, the size occupied by each pixel is reduced, and the resolution is improved.

Optionally, referring to FIG. 7a, the first sub-pixel 10 further includes a first driving circuit 12, and the second sub-pixel 20 further includes a second driving circuit 22. In the first sub-pixel 10, the first driving circuit 12 is electrically coupled to the anode 111 of the first OLED component 11. In the second sub-pixel 20, the second driving circuit 22 is electrically coupled to the anode 111 of the second OLED component 21. The cathode 113 is formed in the entire display area 200.

Optionally, as shown in FIG. 7a, a transparent insulating layer 50 is formed in the area corresponding to the third sub-pixel 30 between the cathode 113 and the base substrate 100 to flatten the cathode 113.

It should be noted that, in the process of forming the first sub-pixel 10 and the second sub-pixel 20, the film thickness of the area on the same side of the base substrate 100 and corresponding to the third sub-pixel 30 is smaller than the film thicknesses in the first sub-pixel 10 and the second sub-pixel 20, thereby resulting in a large thickness difference. Therefore, when the transparent insulating layer 50 is provided in the area corresponding to the third sub-pixel 30 on the same side of the base substrate 100 as the first sub-pixel 10 and the second sub-pixel 20, the film thickness of the area can be increased, thereby decreasing the thickness difference between the area corresponding to the third sub-pixel 30 and the first sub-pixel 10 and the second sub-pixel 20.

In some embodiments, the third sub-pixel 30 includes the first area 310 and the second area 320, a transparent insulating layer 50 is formed in an area between the cathode 113 and the base substrate 100 and corresponding to the first area 310. As such, the film layer under the cathode 113 is flatter.

Optionally, referring to FIG. 7b, the first sub-pixel 10 further includes a first driving circuit 12, and the second sub-pixel 20 further includes a second driving circuit 22. In the first sub-pixel 10, the first driving circuit 12 is electrically coupled to the anode 111 of the first OLED component 11; in the second sub-pixel 20, the second driving circuit 22 is electrically coupled to the anode 111 of the second OLED component 21. The cathode 113 is formed in the entire display area 200.

Optionally, as shown in FIG. 7b, the cathode 113 is in direct contact with the base substrate 100 in the area corresponding to the third sub-pixel 30. By directly contacting the cathode 113 with the base substrate 100, the transmittance of light emitted by the third sub-pixel 30 can be increased.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A display substrate, comprising:
   a base substrate; and
   a plurality of pixels in a display area on the base substrate, at least one of the plurality of pixels comprising a first sub-pixel, and a third sub-pixel, the first sub-pixel comprising an OLED (organic light emitting device) component that emits light of a first color, the third sub-pixel comprising a LED (light emitting device) component that emits light of a third color, and the first color and the third color being different colors;
   wherein all sub-pixels including OLED components are disposed on a first side of the base substrate, and all sub-pixels including LED components are disposed on a second side of the base substrate opposite to the first side on which the OLED components are disposed;
   the first sub-pixel includes a first driving circuit, the third sub-pixel includes a third driving circuit, the first driving circuit drives the first sub-pixel, the third driving circuit drives the third sub-pixels, the third driving circuit and the third sub-pixel are disposed on a first side of the base substrate, the first driving circuit and the first sub-pixel are disposed on a second side of the base substrate, the first driving circuit and the third driving circuit are separated by the base substrate;
   the LED components and the OLED components emit light from different light emitting materials, the LED components emits light from inorganic materials, and the OLED components emits light from organic materials;
   the LED component that emits light of the third color from an inorganic material has a longer life span than an OLED component that emits light of the third color from an organic material;
   the OLED component that emits of the third color is absent in the at least one of the plurality of pixels;
   orthographic projection of the OLED component on the base substrate does not overlap orthographic projection of the LED component on the base substrate, and the OLED component and the LED component emit light in a same direction; and
   the base substrate includes a first sub-base substrate, a second sub-base substrate, and a bonding layer between the first sub-base substrate and the second sub-base substrate, the first sub-base substrate includes the first side of the base substrate, the second sub-base substrate includes the second side of the base substrate, the first sub-pixel is disposed on the first side of the base substrate, and the third sub-pixel is on the second side of the base substrate, and light emitted from the third sub-pixel propagates through the second sub-base substrate, the bonding layer, and the first sub-base substrate in the same direction.

2. The display substrate of claim 1, wherein light of the third color is blue light.

3. The display substrate of claim 1, wherein the at least one of the plurality of pixels further comprises a second sub-pixel, the second sub-pixel comprises an OLED component that emits light of a second color, the light of the first color, the light of the second color, and the light of the third color are light of three primary colors; and
   the light of the first color is red light, the light of the second color is green light, and the light of the third color is blue light.

4. The display substrate of claim 3, wherein the OLED component that emits the light of the first color in the first sub-pixel and the OLED component that emits the light of the second color in the second sub-pixel are top-emitting OLED components.

5. The display substrate of claim 4, wherein the third sub-pixel comprises a first area and a second area, the LED component is in the first area, and a third driving circuit that drives the LED component to emit light is in the second area, and the second area overlaps the area where the first sub-pixel and/or the second sub-pixel are located.

6. The display substrate of claim 3, wherein the second sub-pixel further comprises a second driving circuit; and
   in the first sub-pixel, the first driving circuit is electrically coupled to an anode of the OLED component that emits the light of the first color; in the second sub-pixel, the second driving circuit is electrically coupled to an anode of the OLED component that emits the light of the second color.

7. The display substrate of claim 6, further comprising a cathode, an electron injection layer, and an electron transport layer, wherein the cathode, the electron injection layer, and the electro transport layer are respectively a layer in the entire display area.

8. The display substrate of claim 1, wherein a transparent insulating layer is disposed in an area corresponding to the third sub-pixel between a cathode and the base substrate, and orthographic projection of the transparent insulating layer on the base substrate is located within orthographic projection of the third sub-pixel on the base substrate.

9. The display substrate of claim 1, wherein in an area corresponding to the third sub-pixel, a cathode of the first sub-pixel and a second sub-pixel is in direct contact with the base substrate.

10. The display substrate of claim 1, further comprising an encapsulation layer on a light exit side of the OLED component and in the display area.

11. The display substrate of claim 10, further comprising a black matrix on a side of the encapsulation layer opposite from the base substrate; wherein the black matrix is in a non-light emitting area of the display area.

12. The display substrate of claim 11, further comprising an optical adjustment layer on a side of the encapsulation layer facing the OLED component; the optical adjustment layer being in the display area.

13. The display substrate of claim 1, wherein the LED component is a micro LED component or mini LED component.

14. A display apparatus, comprising the display substrate according to claim 1.

15. The display substrate of claim 1, wherein the at least one of the plurality of pixels further comprises a second sub-pixel, the second sub-pixel comprises a second driving circuit and an OLED component that emits light of a second color, the second driving circuit and the second sub-pixel are disposed on the second side of the base substrate, the second driving circuit and the third driving circuit are separated by the base substrate.

16. The display substrate of claim 15, wherein orthographic projection of the third driving circuit on the base substrate overlaps at least one of orthographic projection of the first driving circuit and orthographic projection of the second driving circuit on the base substrate.

17. A method for preparing a display substrate, comprising:
   forming a first sub-pixel on a first surface of a base substrate, wherein the first sub-pixel comprises an OLED (organic light emitting device) component that emits light of a first color; and forming a third sub-pixel on a second surface of the base substrate, wherein the second surface is opposite to the first surface, the third sub-pixel comprises an LED (light emitting device) component emitting light of a third color, and the first color and the third color are different colors;

wherein the LED components and the OLED components emit light from different light emitting materials, the LED components emits light from inorganic materials, and the OLED components emits light from organic materials;

the LED component that emits light of the third color from an inorganic material has a longer life span than an OLED component that emits light of the third color from an organic material;

the OLED component that emits of the third color is absent;

orthographic projection of the OLED component on the base substrate does not overlap orthographic projection of the LED component on the base substrate, and the OLED component and the LED component emit light in a same direction; and the base substrate includes a first sub-base substrate, a second sub-base substrate, and a bonding layer between the first sub-base substrate and the second sub-base substrate, the first sub-base substrate includes the first surface of the base substrate, the second sub-base substrate includes the second surface of the base substrate, and light emitted from the third sub-pixel propagates through the second sub-base substrate, the bonding layer, and the first sub-base substrate in the same direction.

18. The method of claim 17, wherein forming the first sub-pixel and the second sub-pixel on the first surface of the base substrate comprises forming the first sub-pixel and the second sub-pixel on the first sub-base substrate, and forming the third sub-pixel on the second surface of the base substrate comprises forming the third sub-pixel on the second sub-base substrate.

* * * * *